United States Patent [19]
Ogata et al.

[11] Patent Number: 4,965,657
[45] Date of Patent: Oct. 23, 1990

[54] RESIN ENCAPSULATED SEMICONDUCTOR DEVICE

[75] Inventors: Masatsugu Ogata; Tadanori Segawa, both of Hitachi; Hidetoshi Abe, Katsuta; Shigeo Suzuki, Hitachi; Tatsuo Kawata, Shimodate, all of Japan

[73] Assignees: Hitachi Ltd.; Hitachi Chemical Co., Ltd., both of Tokyo, Japan

[21] Appl. No.: 227,605

[22] Filed: Aug. 2, 1988

[30] Foreign Application Priority Data

Aug. 3, 1987 [JP] Japan .................. 62-192684

[51] Int. Cl.⁵ .......................... H01L 23/28
[52] U.S. Cl. ..................... 357/72; 525/481; 525/527
[58] Field of Search ............ 357/72; 525/481, 527

[56] References Cited

U.S. PATENT DOCUMENTS

| | | | |
|---|---|---|---|
| 3,218,369 | 11/1965 | Hinkley | 525/527 |
| 3,378,434 | 4/1968 | Harrington | 525/527 |
| 4,282,136 | 5/1981 | Hunt et al. | 260/38 |
| 4,550,129 | 10/1985 | Nir, Sr. | 523/433 |
| 4,710,796 | 12/1957 | Ikeya et al. | 357/72 |
| 4,873,309 | 10/1989 | Corley | 528/102 |

FOREIGN PATENT DOCUMENTS 54-113256 4/1979 Japan .
58-110072 6/1983 Japan .
60-054458A 3/1985 Japan .
63-288051A 11/1988 Japan .

OTHER PUBLICATIONS

Windell et al, 'Plastic Outgassing Induced Wire Bond Failure,' Proceedings of the 27th Electronic Components Conference, (1977).
22nd Annual Proceedings Reliability Physics, pp. 37–47 (1984).
IEEE Transactions on Components, Hybrids, and Manufacturing Technology, vol. CHMT-9, No. 4, pp. 379–385 (1986).
25th Annual Proceedings Reliability Physics, pp. 28–33 (1987).

Primary Examiner—Andrew J. James
Assistant Examiner—Stephen D. Meier
Attorney, Agent, or Firm—Antonelli, Terry, Stout & Kraus

[57] ABSTRACT

A resin encapsulated semiconductor device sealed with an epoxy resin molding material particularly containing a brominated epoxy resin as a flame retardant with the bromine content of 0.5% by weight or less, antimony oxide as a flame retardant in an amount of 2.0% by weight or more and a quaternary phosphonium tetrasubstituted borate as a curing accelerator is excellent in connection reliability at Au/Al junctions and heat resistance.

12 Claims, 1 Drawing Sheet

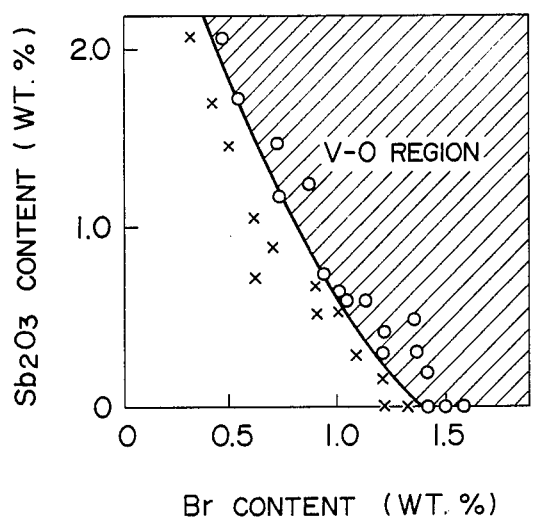

RESIN ENCAPSULATED SEMICONDUCTOR DEVICE

BACKGROUND OF THE INVENTION

This invention relates to a resin encapsulated semiconductor device excellent in connection reliability between an electrode surface of an element and bonding wires particularly at high temperatures.

Recently as a packaging material for electronic parts mounting diodes, thyristors, transistors, IC, LSI, or VLSI, or these various semiconductor elements, there have been used plastic materials, particularly epoxy resins have been used mainly. Such resin packaged semiconductor devices occupy 80% or more of total semiconductor products.

Heretofore, the upper limit temperature of using these resin encapsulated semiconductor devices was about 125° C. But with enlarged utility, there have been desired to use resin encapsulated semiconductor devices at higher temperatures. On the other hand, in order to increase a mounting density of parts, a packaging form is changed from a pin inserting type typified by dual inline plastic package (DILP), zigzag inline plastic package (ZIP), etc. to a surface mounting type typified by small outline package (SOP), flat plastic package (FPP), plastic leaded chip carrier (PLCC), etc. For mounting parts (soldering of parts), infrared rays and a vaper reflow method are employed. When the temperature of inside of package at the time of mounting is measured, it is about 100° to 130° C. at most in the case of the pin inserting type parts since a pointed end of lead inserted into a through-hole of a substrate is heated with solder.

In contrast, in the case of surface mounting type parts, since whole the package is heated with infrared rays and high temperature vapor, the inside of package is sometimes heated to such a high temperature as 215° C. or more. In such a case, the heat time is as relatively short as several tens seconds. But such a high temperature is considerably severe to an epoxy resin used for packaging. For example, when subjected to such a heating treatment, various reliabilities are lowered compared with non-treated products. Various references, e.g. Proc. of the 27th Electronics Components Conference, pp 182-187 (1977), 22nd Annual Proceedings Reliability Physics, pp 37-47 (1984), IEEE Transactions on Components, Hybrids, and Manufacturing Technology, vol. CHMT-9, No. 4, pp 379-385 (1986), 25th Annual Proceedings Reliability Physics, pp 28-33 (1987), etc., report influences of halogens such as Br on gold-aluminum bonds, but there is disclosed no solution to improve gold-aluminum wire bond failure. From such a point of view, the development of resin encapsulated semiconductor devices good in heat resistance have been desired eagerly.

SUMMARY OF THE INVENTION

It is an object of the present invention to provide a resin encapsulated semiconductor device excellent in connection reliability between electrode surfaces of the element and bonding wires under high temperatures.

This invention provides a resin encapsulated semiconductor device sealed with an epoxy resin molding material, characterized in that said epoxy resin molding material comprises an epoxy resin, a brominated epoxy resin as a flame retardant, the bromine content in the molding material being 0.5% by weight or less, antimony oxide as a flame retardant in an amount of 2.0% by weight or more, an inorganic particle filler in an amount of 60 to 85% by weight, and a quaternary phosphonium tetrasubstituted borate as a curing accelerator.

BRIEF DESCRIPTION OF THE DRAWING

The attached drawing is a graph showing an influence of a bromine content and antimony trioxide content on flame retardancy based on the UL-94 standard.

DESCRIPTION OF THE PREFERRED EMBODIMENTS

It is disclosed in various references that when resin encapsulated semiconductor devices are allowed to stand at a temperature higher than 200° C., a junction portion between a gold wire and an aluminum electrode pad is peeled to damage the connection [e.g. 22nd Annual Proceedings Reliability Physics, pp. 37 to 47 (1984); etc.]. There are two theories for explaining such a phenomenon; one of which is based on chemical corrosion of gold/aluminum intermetallic compound layer by a halogen compound such as chlorine, bromine or the like contained in the encapsulating resin, and another of which is based on mechanical stress generated by thermal deterioration of the encapsulating resin.

The present inventors have admitted this phenomenon and studied causes of such a phenomenon and how to prevent it. Further, it was also found that the same phenomenon as mentioned above takes place between copper wire and aluminum electrode. Further study of the cause of such a phenomenon revealed that a free halogen amount generated in the encapsulating resin by thermal deterioration causes such a phenomenon, rather than the mechanical stress generated by thermal deterioration of the encapsulating resin. The present inventors further studied in detail as to a source of generating such a free halogen. As a result, it was found that most of the free halogen is derived from halogen impurities contained in a brominated epoxy resin used for making the epoxy resin molding material flame retardant, and a low molecular weight bromine compound generated by pyrolysis of the brominated epoxy resin. Therefore, it became clear that the connection reliability between the element and the lead wire in the case of standing resin encapsulated semiconductor devices at high temperatures was able to be improved greatly by increasing the purity of the encapsulating resin, particularly that of the brominated epoxy resin used as a flame retardant and lowering the amount of free bromine compound generated by pyrolysis of brominated epoxy resin.

The epoxy resin molding material for sealing semiconductors contains various components such as an epoxy resin, a curing agent, a curing accelerator, a filler, a flame retardant, a coupling agent, a mold release agent, a colorant, a flexibilizer, a thixotropic agent, a reactive diluent, etc. In order to lower the free halogen concentration i the encapsulating resin, it is necessary to make the purity of these components higher so as to particularly lower the free halogen concentration. But the most important thing is that the purity of the brominated epoxy resin used as a flame retardant is made higher and the free bromine compound generated by pyrolysis is lowered. In order to solve such problems, the present inventors have studied a relationship between the molding material composition and thermal deterioration properties of molded articles, particularly the generating amount of free halogen.

As a result, it was found that in the case of using a brominated epoxy resin and antimony oxide, particularly antimony trioxide as a flame retardant, it was better to make the proportion of the brominated epoxy resin smaller and to make the proportion of the antimony oxide larger, and at the same time to use a special phosphonium tetrasubstituted borate as a curing accelerator.

It is possible to make an epoxy resin molding material flame retardant by adding a brominated epoxy resin singly as a flame retardant. In this case, the brominated epoxy resin should be compounded in a considerably large amount as to the total amount of the molding material and the bromine content should be about 1.4% by weight or more, although the bromine content may be changed slightly depending on the amount of filler in the molding material. But since the brominated epoxy resin has a lower pyrolysis temperature than non-brominated epoxy resins, a molding material (as well as a molded article) compounding a large amount of the brominated epoxy resin is inferior in stability at high temperatures. Thus, antimony trioxide is co-used in order to lessen the compounding amount of the brominated epoxy resin. But when a large amount of antimony trioxide was used, there arose a problem that corrosion of aluminum wirings and electrode pads easily took place, particularly when a resin encapsulated semiconductor device was placed under a high temperature and high humidity. Therefore, it was impossible to use a remarkably large amount of antimony trioxide in order to decrease the compounding amount of brominated epoxy resin. Then, the present inventors have studied in detail as to the corrosion mechanism of aluminum wirings and electrode pads in the case of using a large amount of antimony trioxide. As a result, it was found that such a problem is caused by a large amount of free halogen present in the molding material, and the corrosion of aluminum does not take place even if the compounding amount of antimony trioxide is increased, when the amount of free halogen is lessened.

The present inventors further found that the generating amount of free halogen produced in the cured resin varies considerably when the cured resin is allowed to stand at high temperatures depending on the kind of curing accelerator used for accelerating the curing reaction of epoxy resins. Thus, by selecting a proper curing accelerator, it becomes possible to control the reaction for generating free halogen in addition to the use of a small amount of brominated epoxy resin so as to lessen the generation of free halogen. Therefore, the generation of free halogen can be reduced remarkably compared with a known method.

In the present invention, the bromine content in the whole molding material should be 0.5% by weight or less. If the bromine content is more than 0.5% by weight, thermal stability of molded articles is lowered and free halogen can easily be produced by heating the molded articles.

The contents of $Cl^-$ and $Br^-$ in the epoxy resin molding material are preferably 10 ppm or less, respectively, per 1 g of the molding material, when measured by pulverizing so as to pass 200 mesh sieve (Tyler standard) (74 $\mu$m or less) without subjected to heat treatment, dipping 5 g of the resulting powder in 50 g of pure water at 120° C. for 120 hours for extracting, and measuring the $Cl^-$ and $Br^-$ contents by a conventional method.

The content of antimony oxide should be 2.0% by weight or more. If the content is less than 2.0% by weight, sufficient flame retardancy cannot be obtained.

Examples of antimony oxide are antimony trioxide and antimony pentaoxide. The use of antimony trioxide is more preferable. Thus, explanation will be made by using antimony trioxide hereinafter. When antimony trioxide is used in a large amount, it functions as a filler. But considering moisture resistance reliability as mentioned above, the amount of up to 10% by weight is preferable.

As the curing accelerator for epoxy resin, there can generally be used various amines, imidazoles, boron trifluoride complexes, various Lewis acids, etc. But in the present invention, special phosphonium tetrasubstituted borates are used as the curing accelerator. This is because the generating amount of free halogen in cured articles is small even if the cured articles are allowed to stand at high temperatures.

The quaternary phosphonium tetrasubstituted borates can be obtained by reacting phosphonium chloride or bromide with an alkali metal salt of tetrasubstituted boron in an aqueous solution or a mixed solution of alcohol/water.

Examples of the quaternary phosphonium tetrasubstituted borates are tetrabutylphosphonium tetraphenylborate, n-butyltriphenylphosphonium tetraphenylborate, tetraphenylphosphonium tetraphenylborate, trimethylphenylphosphonium tetraphenylborate, diethylmethylphenylphosphonium tetraphenylborate, diallylmethylphenylphosphonium tetraphenylborate, (2-hydroxyethyl)triphenylphosphonium tetraphenylborate, ethyltriphenylphosphonium tetraphenylborate, p-xylenebis(triphenylphosphonium tetraphenylborate), tetraphenylphosphonium (n-butyl)triphenylborate, tetraphenylphosphonium tetra(n-butyl)borate, tetra(n-butyl)-phosphonium tetra(n-butyl)borate, etc. These quaternary phosphonium tetrasubstituted borates can be used singly or as a mixture thereof.

The above mentioned curing accelerator can be used in the same manner as ordinary curing accelerators and preferably used in an amount of 1 to 10 mmoles (e.g. 0.3 to 5 parts by weight) per 100 parts by weight of the epoxy resin.

The epoxy resin used in the present invention is not particularly limited. There can be used cresol novolak type epoxy resins, phenol novolak type epoxy resins, bisphenol A type epoxy resins and the like, these epoxy resins being widely used as a molding material for sealing semiconductor devices. As a curing agent, there can be used phenol novolak resins, polycarboxylic anhydrides, polyamine isocyanates, etc. The curing agent is usually used in an amount of 0.5 to 1.5 equivalents, more preferably 0.8 to 1.2 equivalents based on the weight of the epoxy resin. As the brominated epoxy resin, there can be used brominated cresol novolak type epoxy resins, brominated phenol novolak type epoxy resins, brominated bisphenol A type epoxy resins, etc.

As the inorganic particle filler, there can be used fine powders of at least one of silica, molten silica having an average particle size of 5-30 $\mu$m, silica glass, crystalline silica, alumina, potassium carbonate, zirconium silicate, calcium silicate, talc, clay, mica, and the like. The inorganic filler is usually used in an amount of 60 to 85% by weight based on the total weight of molding material.

The epoxy resin molding material used in the present invention may contain a mold release agent such as carnauba wax, montan waxes, polyalkylene waxes, etc., a coupling agent such as a silane compound, a titanium compound, an aluminum chelate, an aluminum/zirconium compound, etc., one or more colorants such as carbon black, titanium oxide, red lead oxide, ultramarine blue, red oxide, and the like.

The epoxy resin molding material used in the present invention usually has the following composition:

| | | |
|---|---|---|
| Resin components | Epoxy resin<br>Curing agent<br>Curing accelerator<br>Flame retardant<br>(Br-epoxy resin) | 15 to 40%<br>by weight |
| Fillers | Flame retardant<br>($Sb_2O_3$, etc.)<br>Filler | 60 to 85%<br>by weight |
| Additives | Coupling agent<br>Mold release agent<br>Colorants<br>Flexibilizer | 2-3% by wt.<br>1-2% by wt.<br>1-2% by wt.<br>0-10% by wt.<br>based the resin components |

These components or additives are usually melt kneaded at about 60 to 80° C. using a roll, extruder, kneader or the like to give the molding material.

The semiconductor element to be sealed by the epoxy resin molding material means a functioning element comprising a semiconductor substrate having at least one pn-junction exposed to the surface thereof, an electrically insulating film formed on the main surface of said substrate, and a conductor formed on said insulating film. At least electrode portion of said semiconductor element is made of aluminum and bonding wire is made of gold or copper.

The present invention is illustrated by way of the following Examples, in which all parts and percents are by weight unless otherwise specified.

EXAMPLES 1 and 2, COMPARATIVE EXAMPLES 1 and 2

Epoxy resin molding materials were prepared by using various raw materials as shown in Table 1 and changing the compounding amounts of brominated epoxy resin and antimony trioxide. Each molding material was adjusted so as to contain 65% of inorganic fillers (molten silica powder and antimony trioxide) and 35% of other organic components. As to the resin components, the amount of curing agent (phenol novolak resin) was adjusted depending on the amount of brominated epoxy resin so as to make the equivalent ratio of the epoxy group of epoxy resin to the hydroxyl group of phenol resin 1/1.

TABLE 1

| | | Extracted halogen (ppm) | |
|---|---|---|---|
| Material | | $Cl^-$ | $Br^-$ |
| Epoxy resin | o-Cresol novolak type epoxy resin | 2 | <1 |
| Curing agent | Phenol novolak resin | 2 | <1 |
| Curing accelerator | Tetraphenylphosphonium tetraphenylborate | 10 | <1 |
| Flame retardant | Brominated bisphenol A type epoxy resin | 6 | 15 |
| | Antimony trioxide | <1 | <1 |
| Filler | Molten silica | <1 | <1 |
| Coupling agent | γ-Glycidoxypropyl-trimethoxysilane | 13 | <1 |
| Mold release agent | Montan wax | 3 | <1 |

TABLE 1-continued

| | | Extracted halogen (ppm) | |
|---|---|---|---|
| Material | | $Cl^-$ | $Br^-$ |
| Colorant | Carbon black | 7 | <1 |

In Table 1, the extracted halogen was measured as follows. Pure water in an amount of 50 g was mixed with 5 g of a material and heated at 60° C. for 24 hours. Extracted $Cl^-$ and $Br^-$ in the pure water were analyzed by ion chromatography. The extracted amounts were converted to amounts per unit weights of individual materials.

Individual materials as listed in Table 1 were preliminarily mixed (dry blended), kneaded by using a biaxial roll (roll surface temperature, about 80° C) for 10 minutes, cooled and pulverized by using a grinder to give molding materials.

Samples of 12.7 mm wide, 127 mm long and 1.6 mm thick were molded by using each molding material using a transfer molding machine at a mold temperature of 180° C., molding pressure of 75 kgf/cm² and a curing time of 1.5 minutes. Post cuing was conducted at 180° C for 6 hours. The samples were subjected to a flame retardancy test according to UL-94 standard. The results are shown in the attached drawing.

The attached drawing is a graph showing a relationship between the bromine and antimony trioxide contents and flame retardancy according to UL-94 standard. As is clear from the attached drawing, in order to obtain the flame retardancy grade of V-0 according to UL-94 standard, it is possible to compound only the brominated epoxy resin as a flame retardant, but the co-use of antimony trioxide makes it possible to reduce the amount of the brominated epoxy resin remarkably.

In the next place, a semiconductor element obtained by forming a zigzag wiring pattern with an aluminum-silicon alloy (silicon content, about 1%) with 1 μm thick and 10 μm wide on a thermally oxidized film of silicon wafer was mounted on a lead frame and wire bonded with gold wires, followed by sealing with a molding material as listed in Table 2.

Packaging of the semiconductor element was carried out by using a transfer press at a mold temperature of 180° C., a mold pressure of 75 kgf/cm², and a curing time of 1.5 minutes. After molding, post cure was carried out at 180° C. for 6 hours.

The resulting resin encapsulated semiconductor devices were allowed to stand in a constant temperature bath maintained at 220° C and changes of resistance values between lead frame-gold wire-element-lead frame were measured. Further, free halogen concentrations were measured by using molded samples obtained from individual molding materials. That is, each molded sample (not heat treated, and after heated at 220° C for 200 hours) was pulverized to pass 200 mesh sieve (Tyler Standard), the resulting powder was mixed with pure water and heated at 120° C for 120 hours, and extracted halogen ions into the pure water were measured by ion chromatography.

The results are shown in Table 2.

In Table 2, the extracting conditions were as follows. Pure water in an amount of 50 g was mixed with 5 g of powder of a molded article and heated at 120° C. for 120 hours. Extracted $Cl^-$ and $Br^-$ in the pure water were analyzed by ion chromatography. The extracted amounts were converted to amounts per unit weights of individual molded articles.

TABLE 2

|  | Example No. | Example 1 | Example 2 | Comparative Example 1 | Comparative Example 2 |
|---|---|---|---|---|---|
| Molding material composition (parts) | o-Cresol novolak epoxy resin | 94 | 96 | 91 | 88 |
|  | Brominated bisphenol A epoxy resin | 6 | 4 | 9 | 12 |
|  | Phenol novolak resin | 54 | 54 | 54 | 54 |
|  | Tetraphenylphosphonium tetraphenylborate | 2 | 2 | 2 | 2 |
|  | Antimony Trioxide | 15 | 30 | 15 | 15 |
|  | Moletn silica | 405 | 385 | 405 | 405 |
|  | γ-Glycidoxypropyl-trimethoxysilane | 1 | 1 | 1 | 1 |
|  | Montan wax | 1 | 1 | 1 | 1 |
|  | Carbon black | 1 | 1 | 1 | 1 |
| $Sb_2O_3$ content in molding material (%) |  | 2.6 | 5.2 | 2.6 | 2.6 |
| Br content in molding material (%) |  | 0.50 | 0.33 | 0.75 | 1.00 |
| Flame retardancy of molded article |  | V-O | V-O | V-O | V-O |
| Generation of connection failure (failed no./ total no.) | after 220° C./200 hrs | 0/30 | 0/30 | 3/30 | 30/30 |
|  | after 220° C./400 hrs | 0/30 | 0/30 | 19/30 | — |
|  | after 220° C./1000 hrs | 5/30 | 0/30 | 30/30 | — |
| Halogen ions extracted from molded article (Initial time) (ppm) | $Cl^-$ | 3 | 2 | 5 | 8 |
|  | $Br^-$ | 5 | 4 | 8 | 12 |
| Halogen ions extracted from molded article after heated at 220° C. for 200 hrs. (ppm) | $Cl^-$ | 10 | 8 | 15 | 23 |
|  | $Br^-$ | 15 | 12 | 75 | 125 |

As is clear from Table 2, the molded articles of Examples 1 and 2 wherein the compounding amounts of brominated epoxy resin (Br content in the molding materials) are small, the extracted amounts of $Cl^-$ and $Br^-$, particularly after heated at 220° C. for 200 hours, are small and generating percents of connection failure at Au/Al junctions are also low.

EXAMPLES 3 to 7, COMPARATIVE EXAMPLES 3 to 7

Using a curing accelerator as listed in Table 3, a molding material was prepared in the same manner as described in Example 1 with the same composition. Using the resulting molding materials, various tests were carried out in the same manner as described in Example 1. The results are shown in Table 4.

TABLE 3

| Curing accelerator | Extracted halogen (ppm) $Cl^-$ | Extracted halogen (ppm) $Br^-$ |
|---|---|---|
| Butyltriphenylphosphonium tetraphenylborate (BTPP-TBP) | 5 | 15 |
| Tetrabutylphosphonium tetraphenylborate (TBP-TPB) | 3 | 10 |
| Tetraphenylphosphonium butyltriphenylborate (TPP-BTPB) | 4 | 16 |
| Tetraphenylphosphonium tetrabutylborate (TPP-TBB) | 12 | 20 |
| Tetrabutylphosphonium tetrabutylborate (TBP-TBB) | 10 | 25 |
| Triphenylphosphine (TPP) | 6 | 1 |
| 2-Ethyl-4-methylimidazole (EMI) | 18 | 2 |
| 1,8-Diazabicyclo(5,4,0)-undecene (DBU) | 12 | 2 |
| Benzyldimethylamine (BDMA) | 5 | <1 |
| 1-Methyl-piperazine (MP) | 2 | <1 |

In Table 3, the extracted halogen was measured as follows. Pure water in an amount of 50 g was mixed with 5 g of a curing accelerator and heated at 60° C. for 24 hours. Extracted $Cl^-$ and $Br^-$ in the pure water were analyzed by ion chromatography. The extracted amounts were converted to amounts per unit weights of individual curing accelerators.

TABLE 4

| Example No. Curing accelerator |  | 3 BTPP-TPB | 4 TBP-TPB | 5 TPP-BTPB | 6 TPP-TBB | 7 TBP-TBB |
|---|---|---|---|---|---|---|
| Generation of connection failure (failed no./ total no.) | 220° C./200 hrs | 0/30 | 0/30 | 0/30 | 0/30 | 0/30 |
|  | 220° C./400 hrs | 0/30 | 0/30 | 0/30 | 0/30 | 1/30 |
|  | 220° C./1000 hrs | 0/30 | 0/30 | 2/30 | 5/30 | 2/30 |
| Halogen ions extracted from molded article (Initial time) (ppm) | $Cl^-$ | 3 | 2 | 5 | 4 | 5 |
|  | $Br^-$ | 6 | 5 | 8 | 6 | 7 |
| Halogen ions extracted from molded article after heating at 220° C. for 200 hrs. (ppm) | $Cl^-$ | 12 | 10 | 10 | 15 | 12 |
|  | $Br^-$ | 18 | 16 | 18 | 20 | 18 |
| Comparative Example No. Curing accelerator |  | 3 TPP | 4 EMI | 5 DBU | 6 BDMA | 7 MP |

TABLE 4-continued

| | | | | | | |
|---|---|---|---|---|---|---|
| Generation of connection failure (failed no./ total no.) | 220° C./200 hrs | 0/30 | 5/30 | 1/30 | 0/30 | 3/30 |
| | 220° C./400 hrs | 12/30 | 30/30 | 9/30 | 24/30 | 18/30 |
| | 220° C./1000 hrs | 27/30 | — | 30/30 | 30/30 | 30/30 |
| Halogen ions extracted from molded article (Initial time) (ppm) | Cl⁻ | 3 | 10 | 8 | 4 | 7 |
| | Br⁻ | 8 | 15 | 16 | 9 | 13 |
| Halogen ions extracted from molded article after heating at 220° C. for 200 hrs. (ppm) | Cl⁻ | 12 | 22 | 18 | 16 | 23 |
| | Br⁻ | 50 | 85 | 70 | 90 | 83 |

In Table 4, the extracted halogen was measured as follows. Pure water in an amount of 50 g was mixed with 5 g of powder of a mold article and heated at 120° C for 120 hours. Extracted Cl⁻ and Br⁻ in the pure water were analyzed by ion chromotography. The extracted amounts were converted to amounts per unit weights of individual molded articles.

As is clear from Table 4, when the special phosphonium tetrasubstituted borates are used as a curing accelerator in the molding materials, the extracted amounts of Cl⁻ and Br⁻ are small compared with the molded articles obtained by using other curing accelerators (Comparative Examples), particularly after heated at 220° C for 200 hours, and the generating percents of connection failure at Au/Al junctions are also low.

The connection failures of individual molded articles of Comparative Examples took place at abnormal portions of junctions of gold wires and aluminum electrode pads.

As mentioned above, the resin encapsulated semiconductor device of the present invention is excellent in connection reliability of lead frame-gold wire-element junctions even if allowed to stand at high temperatures for a long period of time and also excellent in heat resistance.

What is claimed is:

1. In a resin encapsulated semiconductor device sealed with an epoxy resin molding material, the improvement wherein said epoxy resin molding material comprises an epoxy resin, a brominated epoxy resin as a flame retardant, the bromine content in the molding material being 0.5% by weight or less, antimony oxide as a flame retardant in an amount of 2.0% by weight or more, an inorganic particle filler in an amount of 60 to 85% by weight, and a quaternary phosphonium tetrasubstituted borate as a curing accelerator.

2. A semiconductor device according to claim 1, wherein the antimony oxide is antimony trioxide.

3. A semiconductor device according to claim 1, wherein the brominated epoxy resin is a brominated cresol novolak epoxy resin, a brominated phenol novolak epoxy resin or a brominated bisphenol A epoxy resin.

4. A semiconductor device according to claim 1, wherein the quaternary phosphonium tetrasubstituted borate is butyltriphenylphosphonium tetraphenylborate, tetrabutylphosphonium tetraphenylborate, tetraphenylphosphonium butyltriphenylborate, tetraphenylphosphonium tetrabutylborate or tetrabutylphosphonium tetrabutylborate.

5. A semiconductor device according to claim 1, wherein the inorganic particle filler is at least one member selected from the group consisting of molten silica having an average particle size of 5–30 μm, crystalline silica and alumina.

6. A semiconductor device according to claim 1, wherein the semiconductor device has a semiconductor element in which an electrode portion is made of aluminum and bonding wire is made of gold or copper.

7. A semiconductor device according to claim 1, wherein the individual components of said epoxy resin molding material have Cl⁻ and Br⁻ contents in amounts of 10 ppm or less, respectively, said contents being determined by pulverizing said components so as to pass 200 mesh sieve without being subject to heat treatment, dipping 5 g of the resulting powder in 50 g of pure water at 120° C. for 120 hours for extracting, and measuring the Cl⁻ and Br⁻ contents by a conventional method.

8. A semiconductor device according to claim 1 wherein the brominated epoxy resin is a brominated cresol novolak epoxy resin, a brominated phenol novolak epoxy resin, or a brominated bisphenol a epoxy resin.

9. A semiconductor device according to claim 8, wherein the quaternary phosphonium trisubstituted borate is butyltriphenylphosphonium tetraphenylborate, tetrabutylphosphonium tetraphenylborate, tetraphenylphosphonium butyltriphenylborate, tetraphenylphosphonium tetrabutylborate, or tetrabutylphosphonium tetrabutylborate.

10. A semiconductor device according to claim 9, wherein the inorganic filler is at least one member selected from the group consisting of molten silica having an average particle size of 5–30 μm, crystalline silica and alumina.

11. A semiconductor device according to claim 10, wherein the semiconductor device has a semiconductor element in which an electrode portion is made of aluminum and bonding wires made of gold or copper.

12. A semiconductor device according to claim 11, wherein extracted contents of Cl⁻ and Br⁻ in individual components in the epoxy resin molding material are 10 ppm or less, respectively.

* * * * *